March 7, 1967 C. B. GWYN, JR 3,308,353
SEMI-CONDUCTOR DEVICE WITH SPECIFIC SUPPORT MEMBER MATERIAL
Filed Sept. 10, 1964
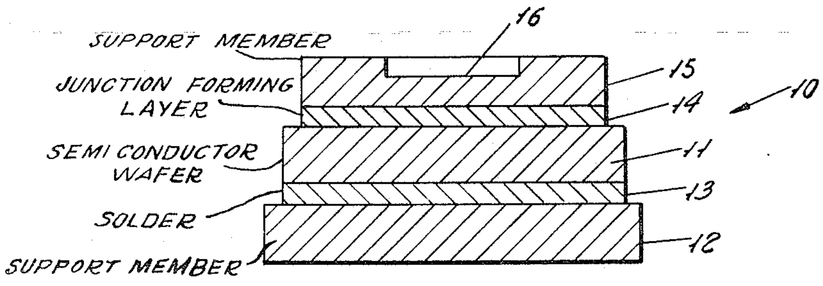
INVENTOR.
CHILDRESS B. GWYN, JR.
BY
OSTROLENK, FABER, GERB & SOFFEN
ATTORNEYS 3,308,353
Patented Mar. 7, 1967

3,308,353

SEMI-CONDUCTOR DEVICE WITH SPECIFIC SUPPORT MEMBER MATERIAL

Childress B. Gwyn, Jr., Export, Pa., assignor to Talon, Inc., Meadville, Pa., a corporation of Pennsylvania Filed Sept. 10, 1964, Ser. No. 395,543
5 Claims. (Cl. 317—234)

The present invention relates to semiconductor rectifier devices of the P–N junction type, and more particularly to such devices incorporating novel support members so constituted as to impart desirable thermal, electrical and mechanical characteristics thereto.

In the following specification all percentages are given by weight unless otherwise specified. Also, principal reference will be made hereinafter to the preparation of semiconductor rectifier devices incorporating silicon semiconductor bodies. It will, however, be understood that semiconductor rectifier elements incorporating germanium semiconductor bodies are also within the scope of this invention, and are comprehended within the scope of the "silicon type" rectifiers referred to hereinafter.

In the manufacture of silicon type power rectifiers and diodes it has been found advantageous, if not absolutely necessary, to utilize members constituted of tungsten and/or molybdenum adhered to and supporting the silicon semiconductor bodies thereof.

Such use of tungsten or molybdenum support plates as described, for example, in U.S. Patent No. 2,933,662 is generally believed necessary to maintain a substantially uniform pressure against the semiconductor elements in high ampere rectifiers rated at or in excess of 100 amperes. It has also been found that the use of such elements is desirable to substantially, if not exactly, match the expansion characteristics of the semiconductor and of the ceramic or glass container or envelope within which the power rectifier or diode device is maintained.

In the lower ampere ranges, i.e., for silicon type rectifier devices rated at up to about 75 amperes, it has often been found possible to use certain iron-nickel-cobalt-manganese or iron-nickel-manganese-carbon alloys as support members for the semiconductor bodies thereof. However, almost universally reported results have indicated that silicon type rectifiers and diodes incorporating such alloy support members have not worked satisfactorily and successfully above the 75 ampere rating.

In general, the tungsten, molybdenum or binary tungsten-molybdenum alloy disks or wafers used for support members in silicon type rectifier devices have been produced from disks or wafers cut from rod or billet stock. The thus punched or cut substantially pure molybdenum, tungsten or molybdenum-tungsten alloy disks are mechanically fragile and brittle, and have been difficult to produce in certain dimensions, particularly in the larger diameters of the order of ½ inch or greater, and in thicknesses greater than 0.015 inch, for example. Frequently, cracking, chipping or warping occurs during the fabrication and/or subsequent assembly and use of silicon type rectifier devices incorporating such tungsten and/or molybdenum support members.

The addition of minor percentages of nickel and/or copper and/or silver has been suggested to improve the mechanical characteristics of tungsten and/or molybdenum support members. The resulting bodies have, however, also been subject to several serious disadvantages, including the fact that such bodies do not properly match the expansion characteristics of the semiconductor bodies and the envelopes therefor, resulting in relatively poor contact with the semiconductor and its container over the required variable temperature operational ranges of such devices. Additionally, such contact members incorporating small percentages of nickel and/or copper and/or silver frequently display varying resistances to their rectifying functions and to current flow.

Furthermore, the addition of small proportions of nickel and/or copper and/or silver does not impart sufficient mechanical strength to the tungsten and/or molybdenum support members previously employed, to permit trouble-free assembly or to maintain sufficiently uniform pressures against the silicon semiconductor bodies. Oxidation, sulfiding, nitriding, and like actions from ambient atmospheres tend to further decrease the usefulness of such materials.

It is among the objects of the present invention to provide semiconductor rectifier devices incorporating novel support members which are thermally and electrically compatible with the semiconductor bodies and the containers for such bodies, and which impart markedly increased mechanical strength to the resulting assemblies.

A further object of the invention is to provide such support members for rectifier devices which satisfactorily match the expansion characteristics of previously known support members manufactured for use in semiconductor rectifier devices.

Yet a further object of the invention is to provide a method for the manufacture of such support members which is simple and economical to carry out.

Other objects and advantages of the invention will be apparent from the following detailed description thereof, taken in connection with the accompanying schematic drawing illustrating a transverse sectional view of a semiconductor rectifier element embodying the present invention.

In accordance herewith, it has been found that markedly improved mechanical strength can be imparted to a silicon type rectifier element comprising a wafer of semiconductor material, a support member having a surface closely conforming to and disposed adjacent a surface of such wafer and a thin layer of solder securing the support member to the semiconductor wafer, without sacrificing the necessary thermal and electrical characteristics of the element, by making use of a support member constituted of an alloyed composition of a first tungsten and/or molybdenum component and a second component comprising a specific iron-nickel-cobalt-manganese or iron-nickel-manganese-carbon alloy. Specifically, the support member provided in accordance with the present invention is constituted of an alloy of from about 90 to 99.5% by weight of a first molybdenum, tungsten, or molybdenum-tungsten binary alloy (containing from about 10 to 90% molybdenum and, correspondingly, from 90 to 10% tungsten) component, and from about ½ to 10% by weight of a second component, which may consist of either (1) an iron-nickel-cobalt-manganese alloy of from about 28 to 30% nickel, 16 to 18% cobalt, 0.2 to 0.3% manganese, and the remainder essentially iron, or (2) an iron-nickel-manganene-carbon alloy of from about 35 to 39% nickel, 0.3 to 0.9% manganese, 0.15 to 0.2% carbon, and the remainder essentially iron.

When the support member composition includes the iron-nickel-manganese-carbon alloy component, it is preferred to utilize such component in the range of from about 0.5 to 7% of the composition, rather than in the broader range of from about 0.5 to 10% which is preferred when the iron-nickel-cobalt-manganese alloy component is so employed. While it will thus be noted that the preferred relative proportions of the first and second components of the support composition vary, within the above ranges, depending upon the particular materials employed, it has been found that inclusion of the second component material in the support member composition, in an amount of from only about 0.5 to 10% of the total composition thereof, markedly increases the mechanical strength and decreases the brittleness of the resulting members, as compared with pure tungsten, molybdenum or binary alloy supports. Hence, when support disks of 0.218 inch diameter and 0.030 inch thickness were tested, it was found that a force of 26 inch pounds was required to shatter the disks when constituted of tungsten cut from rod stock, and a force of 39 inch pounds to shatter such disks when constituted of tungsten punched from sheet stock, whereas a force of 55 inch pounds was required to shatter such disks when constituted of 98.5% tungsten alloyed with 1.5% of an iron-nickel-cobalt-manganese alloy prepared in the manner of Example 1 below. Similarly, the shear force required to break such disks in two was only 9 inch pounds for disks constituted of tungsten cut from rod stock, and 11 inch pounds for disks constituted of tungsten punched from sheet stock, whereas 25 inch pounds was necessary to shear disks prepared, employing the composition, and as described in Example 1.

It will further be noted that, by incorporating the specified alloys within the support member compositions, it is feasible to reduce production cost of the desired support members by amounts of from about 20% to 40%, without deleteriously affecting their characteristics and, as indicated hereinabove, while concomitantly providing increased mechanical strength and decreased brittleness characteristics, as compared with the corresponding pure molybdenum and/or tungsten supports.

Surprisingly, it has also been found that the support disks constituted of molybdenum alloyed with the indicated iron-nickel-manganese-carbon alloy in the proportion of from about 95 to 96.5% manganese and correspondingly, 5 to 3.5% of the alloy, possess greater hardnesses (measured on the Rockwell C Scale) than corresponding support disks constituted of pure cut molybdenum.

As illustrated in the accompanying drawing a rectifier 10 which may incorporate the novel support member hereof, consists of a body of semiconductor material 11 secured to a supporting member or plate 12 by a relatively thin layer of solder 13.

The semiconductor body is itself relatively thin, ordinarily possessing a thickness of approximately 10 mils. As is known in the art, substantially greater thicknesses, e.g., 25 mils, result in less effective rectifier operation, whereas substantially thinner semiconductor wafers, below 5 mils, for example, may be subjected to striking-through, or may otherwise fail. The silicon or germanium wafer 11 comprises a single crystal of either N or P-type conductivity. It may be prepared in the conventional manner with finely polished or lapped surfaces and etched to remove any surface impurities, loose particles, projections, or the like.

The support member 12, having the composition indicated hereinabove, is prepared by the pressing, sintering and impregnating operations described more fully hereinafter, and bonded to the wafer 11 by the layer 13 of solder. The solder layer is made as thin as possible, a thickness of the order of 2 mils or less being desirable, in order to present very little resistance to the flow of heat through the rectifier assembly. Any of the solders previously employed for this purpose may be utilized in accordance herewith, including tin or tin-lead solders such as described in the aforesaid U.S. Patent No. 2,933,662, or silver solders such as described in U.S. Patent No. 2,763,822, for example. It will be understood that the solder composition may be determined in accordance with the conditions to which the rectifier device is to be subjected, and that the solder composition may therefore be varied without departing from the scope of the present invention.

Upon the upper surface of the silicon wafer 11, opposite from the solder layer 13, is applied a thin layer of a material which alloys with the semiconductor body and diffuses into it, converting a portion of the semiconductor to a material of opposite conductivity type and thereby forming a P–N junction to obtain the desired rectifying characteristics. For this purpose, any known materials e.g., aluminum or aluminum base alloys, or indium, which produce a P-type conductivity zone by diffusion into the upper portion of an N-type silicon wafer, for example, may be utilized. It is intended that the layer 14 may additionally include small amounts of impurities which function in known manner to enhance junction formation.

The layer 14, besides producting an alloyed junction, additionally bonds an upper support member 15 constituted of an alloy of the aforesaid tungsten, molybdenum or tungsten-molybdenum component, and the iron-nickel-cobalt-manganese alloy or iron-nickel-manganese-carbon alloy component, to the semiconductor body. As illustrated, the upper support member is provided with a cup or well 16 adapted to receive the end of a conductor to be soldered thereto. It will, of course, be understood that the upper support 15 need not, however, have a cup or well, and can be of any suitable shape or structure enabling firm bonding of a conductor thereto as by soldering.

The support members 12 and 15 may be readily and economically produced by blanking from sheets or cutting from suitable rods or billets and may be produced in a much wider range of sizes and shapes than heretofore feasible employing previously known support member compositions. Moreover, the resulting disks or wafers 12 and 15 are not subject to laminating or cracking, either during assembly or subsequent operation of the rectifier device.

Preferably, the sheets, rods, billets or other shapes from which the wafers 12 and 15 are produced, are manufactured by a method involving initially ball milling at least the first component material of the support member composition, pressing the resulting finely divided powder metal material, e.g., of 100 mesh or finer, into the desired shape, at a pressure of from 5 to 40 tons per square inch and sintering and impregnating the same in a non-oxidizing atmosphere, e.g., in an inert gas such as helium, a reducing gas such as hydrogen, or in a vacuum, at temperatures in excess of about 1300° C., preferably between 1300 and 1600° C., for a period of from about 10 minutes to 25 hours. It has been found that, utilizing such procedure, the second component of the composition of the support member alloys with the tungsten and/or molybdenum component and produces a uniformly dense, mechanically strong body possessing markedly less brittleness than similar tungsten and/or molybdenum materials.

The two component materials of the support member composition, i.e. the tungsten and/or molybdenum first component material and the iron-nickel-cobalt-manganese or iron-nickel-manganese-carbon second component material may be initially ball milled and pressed into the desired sheet, rod or billet shape prior to sintering. In such case, the shaped body is sintered under the conditions indicated above, preferably at temperatures of about 1495° C. for a period of about 15 minutes in an inert or reducing atmosphere, e.g., hydrogen, helium, etc.

Alternatively, the first component material may be initially ball milled and pressed into the desired shape for the support member blank, with or without a minor portion of the second component material to be incorporated therewith. The pressed shape may either be simultaneously sintered and impregnated with the indicated amounts of the alloy constituents of the second component material, or sintered and subsequently infiltrated with the indicated amounts of the second component material.

Employing either of the aforesaid procedures, a homogeneous, mechanically strong blank results from which the support member disk or wafer may be readily cut or punched. As indicated hereinabove, such support member may be produced in a much wider range of sizes than is feasible employing prior art procedures for producing tungsten and/or molybdenum support member bodies.

The following examples illustrate the method of manufacture of silicon type semiconductor rectifier devices incorporating support members made in accordance with the present invention; it will be appreciated that the invention is not limited to the procedures or compositions described in such examples.

*Example 1*

Finely divided powdered tungsten was admixed with a finely divided alloy consisting of 29% nickel, 17% cobalt, 0.2% manganese and the balance iron, in the proportion of 98.5% tungsten and 1.5% of the alloy material, and the mixture ball milled and pressed into rod shape. The composite material was thereafter sintered at a temperature of 1495° C., for a period of 15 minutes in a hydrogen atmosphere.

The product rods were cut into disks which were thereafter gold-plated and brazed, employing a silver-alloy brazing medium, to a suitable support member for contact with a silicon or other semiconductor wafer. The composite assembly thus produced could readily be employed as the support member for the semiconductor wafer in a solid state rectifier device.

*Example 2*

The procedure of Example 1 was repeated, employing a support member composition constituted of 97.2% molybdenum and 2.8% of the nickel-cobalt-manganese-iron alloy identified in Example 1. Support members thus produced provide suitable mounting elements for semiconductor wafers.

*Example 3*

The procedure of Example 1 was repeated, employing a support member composition constituted of 95.5% of a binary tungsten-molybdenum alloy, composed of 70% tungsten and 30% molybdenum, and 4.5% of the nickel-cobalt-manganese-iron alloy identified in Example 1.

*Example 4*

The procedure of Example 1 was repeated, employing a support member composition constituted of 97% tungsten and 3% of an alloy composed of 37% nickel, 0.6% manganese, 0.17% carbon and the balance iron. Support members thus produced provide suitable mounting elements for semiconductor wafers.

*Example 5*

The procedure of Example 4 was repeated, employing a support member composition consisting of 94% molybdenum and 6% of the alloy composition defined in Example 4.

*Example 6*

The procedure of Example 4 was repeated, employing a support member composition consisting of 90.5% of a binary tungsten-molybdenum alloy, composed of 50% tungsten-50% molybdenum, and 9.5% of the alloy identified in Example 4.

Since certain changes may be made in the preferred embodiments described hereinabove without departing from the scope of the invention, it is intended that all matter contained in the above description shall be interpreted as illustrative and not in a limiting sense.

The embodiments of the invention in which an exclusive privilege or property is claimed are defined as follows:

1. In a semiconductor rectifier device of the P-N junction type, which comprises a wafer of semiconductor material, a support member having a surface closely conforming to and disposed adjacent the surface of said semiconductor wafer, and a thin layer of solder securing said support member to said adjacent surface of the semiconductor wafer, the improvement comprising providing said support member constituted of an alloy of (a) from 90 to 99.5% of a first component selected from the group consisting of molybdenum, tungsten and alloys thereof, and (b) from ½ to 10% of a second component selected from the group consisting of (1) iron-nickel-cobalt-manganese alloys constituted of from 28 to 30% nickel, from 16 to 18% cobalt, from 0.2 to 0.3% manganese, and the remainder essentially iron, and (2) iron-nickel-manganese-carbon alloys constituted of from 35 to 39% nickel, from 0.3 to 0.9% manganese, from 0.15 to 0.2% carbon, and the remainder essentially iron, all percentages being given by weight.

2. A semiconductor rectifier device comprising, in combination, (a) a body of semiconductor material selected from the class consisting of germanium and silicon;

(b) a support member having a surface closely conforming to and disposed adjacent one surface of said semiconductor body, said support member being constituted of an alloy of (1) from 90 to 99% of a first component material selected from the group consisting of molybdenum, tungsten and alloys thereof having coefficients of thermal expansion closely corresponding to that of said semiconductor body, and (2) from ½ to 10% of a second component material selected from the group consisting of iron-nickel-cobalt-manganese alloys constituted of from 28 to 30% nickel, from 16 to 18% cobalt, from 0.2 to 0.3% manganese, and the remainder essentially iron, and iron-nickel-manganese-carbon alloys constituted of from 35 to 39% nickel, from 0.3 to 0.9% manganese, from 0.15 to 0.2% carbon, and the remainder essentially iron;

all percentages being given by weight; and (c) a thin layer of a silver solder disposed between and bonding said surface of said semiconductor body to said support member.

3. A semiconductor rectifier device comprising, (a) a body of semiconductor material of one conductivity type selected from the group consisting of germanium and silicon;

(b) a first support member having a surface closely conforming to and disposed adjacent a first surface of said semiconductor body and being constituted of an alloy of (1) from 90 to 99.5% of a first component material selected from the group consisting of molybdenum, tungsten and alloys thereof having coefficients of thermal expansion closely corresponding to that of said semiconductor body, and (2) from ½ to 10% of a second component material selected from the group consisting of iron-nickel-cobalt-manganese alloys constituted of from 28 to 30% nickel, 16 to 18% cobalt, 0.2 to 0.3% manganese, and the remainder essentially iron, and iron-nickel-manganese-carbon alloys constituted of from 35 to 39% nickel, 0.3 to 0.9% manganese, 0.15 to 0.2% carbon, and the remainder essentially iron, all percentages being given by weight;

(c) a thin layer of solder joining said first surface of the semiconductor body to said first support member over a large area with a joint of good thermal and electrical conductivity;

(d) a layer of conductive material on the opposite side of said semiconductor body, said conductive material being of a type which is adapted to alloy with the adjacent semiconductor to convert a portion thereof to the opposite conductivity type and thereby provide a rectifying junction; and (e) a second support member disposed on said opposite side of the semiconductor body and joined thereto over a large area by said conductive material, said second support member being constituted of an alloy of components (1) and (2) above.

4. The semiconductor rectifier device as defined in claim 3, wherein said semiconductor body is constituted of silicon and is bonded to said first support member by a silver solder, and in which said first and second support members are each constituted of an alloy of (1) from 90.0 to 99.5% of a first component selected from the group consisting of molybdenum, tungsten and alloys of from 10 to 90% molybdenum and 90 to 10% tungsten, and (2) from ½ to 10% of a second component selected from the group consisting of iron-nickel-cobalt-manganese alloys constituted of from 28 to 30% nickel, 16 to 18% cobalt, 0.2 to 0.3% manganese, and the remainder essentially iron, all percentages being given by weight.

5. The semiconductor rectifier device as defined in claim 3, wherein said semiconductor body is constituted of silicon and is bonded to said first support member by a silver solder, and in which said first and second support members are each constituted of an alloy of (1) from 93 to 99.5% of a first component selected from the group consisting of molybdenum, tungsten, and alloys of from 10 to 90% molybdenum and 90 to 10% tungsten, and (2) from ½ to 7% of a second component selected from the group consisting of iron-nickel-manganese-carbon alloys constituted of from 35 to 39% nickel, 0.3 to 0.9% manganese, 0.15 to 0.2% carbon, and the remainder essentially iron, all percentages being given by weight.

References Cited by the Examiner

UNITED STATES PATENTS

| | | | |
|---|---|---|---|
| 1,698,935 | 1/1929 | Chesterfield | 75—176 |
| 2,107,122 | 2/1938 | Laise | 75—176 |
| 2,860,972 | 11/1958 | Fraser | 75—176 |
| 2,921,245 | 1/1960 | Wallace et al. | 317—234 |
| 2,922,092 | 1/1960 | Gazzara et al. | 317—234 |
| 2,971,251 | 2/1961 | Willemse | 29—198 |

JOHN W. HUCKERT, *Primary Examiner.*

A. M. LESNIAK, *Assistant Examiner.*